US012742800B2

(12) United States Patent
Bell et al.

(10) Patent No.: US 12,742,800 B2
(45) Date of Patent: Sep. 22, 2026

(54) SAUNA WITH GALVANICALLY ISOLATED ELECTRICAL FAULT DETECTION AND ANALYTICS

(71) Applicant: Sunlighten, LLC, Leawood, KS (US)

(72) Inventors: Steven Bell, Olathe, KS (US); Aaron Michael Zack, Overland Park, KS (US)

(73) Assignee: Sunlighten, LLC, Leawood, KS (US)

( * ) Notice: Subject to any disclaimer, the term of this patent is extended or adjusted under 35 U.S.C. 154(b) by 0 days.

(21) Appl. No.: 18/612,791

(22) Filed: Mar. 21, 2024

(65) Prior Publication Data

US 2024/0319236 A1 Sep. 26, 2024

Related U.S. Application Data

(60) Provisional application No. 63/491,431, filed on Mar. 21, 2023.

(51) Int. Cl.

*G01R 19/165* (2006.01)
*A61H 33/00* (2006.01)
*H02H 3/08* (2006.01)

(52) U.S. Cl.

CPC ..... *G01R 19/16528* (2013.01); *A61H 33/005* (2013.01); *H02H 3/08* (2013.01); *A61H 2201/0184* (2013.01)

(58) Field of Classification Search

CPC .......... A61H 33/005; A61H 2201/0173; A61H 2201/0176; A61H 2201/0184; A61H 2201/5058; A61H 2201/5061; A61H 2201/5082; A61H 2201/5097; G01R 19/16528; H02H 3/08; H02H 3/38

(Continued)

(56) References Cited

U.S. PATENT DOCUMENTS 5,229,579 A 7/1993 Ingraham et al.
5,495,381 A * 2/1996 Mrowiec .................. H02H 3/38 361/79

(Continued)

FOREIGN PATENT DOCUMENTS

CN 217642692 U 10/2022
WO 2021052949 A2 3/2021
WO 2022128219 A1 6/2022

OTHER PUBLICATIONS

Design a Fault-Detection Solution for Your High-Power System; https://www.electronicdesign.com/resources/whitepaper/21243674/texas-instruments-design-a-faultdetection-solution-for-your-highpower-system; Steve Taranovich; Jun. 15, 2022.

(Continued)

*Primary Examiner* — Kevin J Comber
(74) *Attorney, Agent, or Firm* — AVEK IP, LLC; Kent R. Erickson

(57) ABSTRACT

A sauna having various heating, lighting, or other electrically operated elements is equipped with galvanically isolated current detection circuitry and galvanically isolated voltage detection circuitry, each in communication with a processor. The processor is operable to monitor, store and analyze voltage and current data to detect latent malfunctions and to predict and prevent future malfunctions, and to provide reports to users or operators. In various embodiments the processor may alert users to malfunctions or potential problems and may further actuate circuitry to cut power to the sauna upon detection of a malfunction.

20 Claims, 10 Drawing Sheets

(58) Field of Classification Search
USPC .......................................................... 361/93.1
See application file for complete search history.

(56) References Cited

U.S. PATENT DOCUMENTS 5,687,049 A 11/1997 Mangtani
7,516,905 B2 4/2009 Jaeger et al.
9,597,225 B1 3/2017 Guerrieri
9,871,369 B2 1/2018 Ohki
9,908,418 B2 3/2018 Lopez De Arroyabe
10,622,904 B1 4/2020 Menegolo et al.
2005/0018371 A1* 1/2005 Mladenik ................. H02H 3/00 361/78
2009/0281740 A1* 11/2009 Stoupis .................. G01R 31/58 702/58
2009/0304370 A1 12/2009 Dupuis
2019/0238957 A1* 8/2019 Yli-Kovero .............. H04Q 9/00
2020/0200834 A1 6/2020 Uchino et al.
2020/0264216 A1 8/2020 Breitlow et al.
2020/0319621 A1 10/2020 Roy et al.
2021/0083506 A1 3/2021 Rao et al.
2022/0189721 A1 6/2022 Telefus et al.
2022/0249798 A1* 8/2022 Doudkine ........... A61M 16/161

OTHER PUBLICATIONS

Voltage Sensor: Working Principle, Types & Circuit Diagram; https://www.electrical4u.com/voltage-sensor/; Electrical4U; Jan. 31, 2021.

Ragonese et al. An Experimental Comparison of Galvanically Isolated DC-DC Converters: Isolation Technology and Intergration Approach. MDPI. May 15, 2021. [May 17, 2024]. Retrieved from internet.

* cited by examiner

SAUNA WITH GALVANICALLY ISOLATED ELECTRICAL FAULT DETECTION AND ANALYTICS

CROSS-REFERENCE TO RELATED APPLICATIONS

This application claims the benefit of U.S. Provisional Patent Application No. 63/491,431, filed Mar. 21, 2023, the disclosure of which is hereby incorporated herein in its entirety by reference.

BACKGROUND

Saunas are popular for providing heath therapy to users, with dry heat home saunas for one or more users becoming increasingly common as home accessories. Traditional saunas are also popular, and health facilities offering access to various types of saunas allow users to select the type of sauna used at any given session.

Because saunas are typically electrically powered, it is desirable to provide adequate protection to users against any electrical or electronic malfunctions. Most sauna installations typically include some type of general electrical protection circuitry, such as circuit breakers or ground fault circuit interrupters (GFCI). However, circuit breakers are relatively slow to react and generally protect only against current draw over a predetermined limit, and GFCI circuits are designed to detect a mismatch in current flowing from the GFCI to the sauna (or other appliance or device) and current returning to the GFCI and to interrupt the supply of power upon such a detected mismatch.

While such circuitry provides protection against over-current and potential shock or electrocution (or other current leaks) such circuitry does not specifically monitor voltages or currents at one or more points within the sauna, nor does it track or analyze any such information over time.

Thus, it can be seen that there remains a need in the art for an improved system and method for monitoring, detecting, and protecting against electrical and electronic malfunctions in sauna systems.

SUMMARY

Exemplary embodiments are defined by the claims below, not this summary. A high-level overview of various aspects thereof is provided here to introduce a selection of concepts that are further described in the detailed description section below. This summary is not intended to identify key features or essential features of the claimed subject matter, nor is it intended to be used in isolation to determine the scope of the claimed subject matter. In brief, this disclosure describes system and methods for providing galvanically isolated circuitry in a sauna for monitoring, detecting, analyzing, and predicting electrical and electronic malfunctions.

In one embodiment a sauna, such a far infrared sauna system having various heating, lighting, or other electrically operated elements, is equipped with galvanically isolated current detection circuitry and galvanically isolated voltage detection circuitry, each in communication with logic and control circuitry comprising a processor or microcontroller device. The current detection circuitry is connected between a power source for the sauna and a power load of the sauna, with the voltage detection circuitry connected between the power source hot and neutral lines.

Both of the current detection circuitry and the voltage detection circuitry are in communication with the microcontroller device, with the microcontroller operable to detect electrical/electronic failures such as short circuits, open circuits, under-current events, over-current events, and the like. In some embodiments, the microcontroller device is further operable to store and analyze voltage and current data to detect latent malfunctions or to predict and prevent future malfunctions. For example, an increase in current draw over a period of several days may indicate a breakdown in a component that may eventually result in a short circuit. Analysis by the microcontroller can provide an alert of the anomaly to proactively allow a user to investigate and address the issue before such a short circuit occurs. In other embodiments data analysis and processing may be accomplished by a microcontroller or processor external to the sauna, with data communicated between the two processors.

In other embodiments, the voltage and current detection circuitry may be configured to monitor voltage and current at individual components of the sauna, or additional detection circuitry may be included at the individual components, so that the microcontroller can alert a user to a specific problematic component. In other embodiments, additional detection sensors, such as air quality sensors, temperature sensors, and other electrical parameter or environmental sensors may be used to monitor desired parameters. In further embodiments, in addition to alerts, the microcontroller may control additional circuitry to turn off the power source or to electrically isolate components or power loads to prevent electrical flow to those components upon detection of a problem or malfunction.

In still further embodiments, the voltage and current detection circuitry may include temperature sensors to monitor the temperatures of various components within the sauna, with the temperature data also used in the detection, analysis and prediction of actual or potential malfunctions or failures. In other embodiments, the logic and control circuitry and microcontroller device comprise an Internet of Things (IoT) device to allow the sauna to transmit and receive information over local and/or wide area networks, such as the Internet.

DESCRIPTION OF THE DRAWINGS

Illustrative embodiments are described in detail below with reference to the attached drawing figures, and wherein.

DETAILED DESCRIPTION

The subject matter of select exemplary embodiments is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about" or "approximately" as used herein denote deviations that are insignificant to the function.

Figure 1:
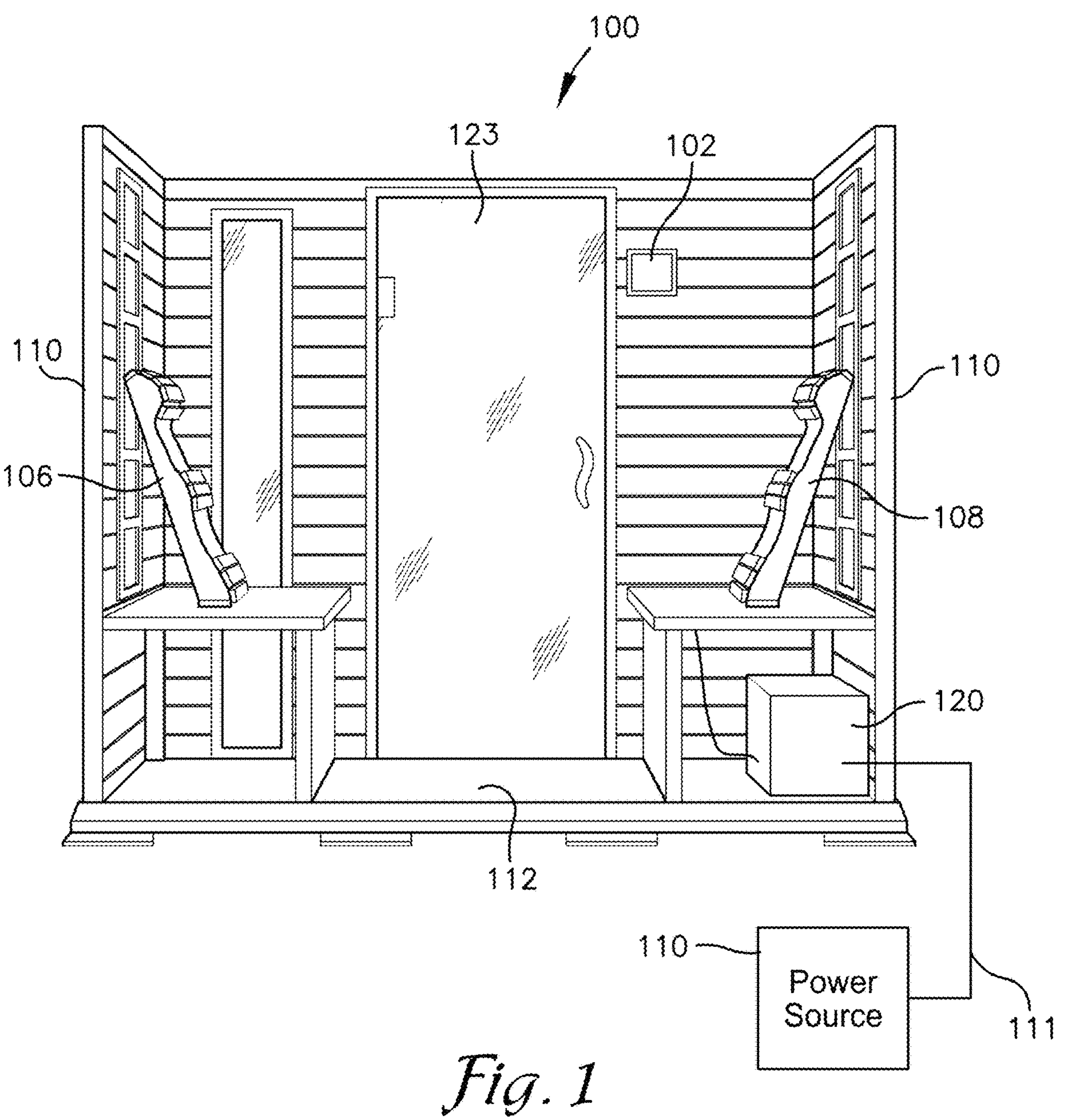
FIG. 1 is a perspective cut-away view of a sauna having galvanically isolated current and voltage detection circuitry in accordance with an exemplary embodiment of the present invention.

Looking to FIG. 1, a forward-facing cut-away view of an interior of a sauna having galvanically isolated current and voltage detection circuitry in accordance with an exemplary embodiment of the present invention is depicted generally as 100. The sauna may include back rests 106, 108, a plurality of wall panels 110, a floor 112, and a door 123 to allow entry and egress.

The sauna 100 may further comprise any arrangement of sauna components, such as a control panel 102 attached, for example, to an interior side of a wall panel. The control panel 102 may include any number of various control, for example, configurations that include a number of buttons, dials, switches, and/or displays disposed thereon. In the embodiment illustrated in FIG. 1, the control panel 102 preferably include a display device such as, for example, a liquid crystal display (LCD) screen, a plasma display screen, or any other type of display screen appropriate for displaying various information associated with a user's sauna experience, and an audio loudspeaker for playback of audio material. In one embodiment, control panel 102 may comprise a touch-screen display device operable to display output as well as to receive user input, where a user may interact with control panel 102 by touching the screen with a finger, stylus, or other object. In still further embodiments, control panel 102 may be a portable device such as, for example, a remote control device or module. In other embodiments, control panel 102 may be adapted to be worn by a user, such as, for example, by affixing straps to a part of the body. In further embodiments, the speaker and control switches may be located remotely from the control panel 102.

Control panel 102 may be integrated with, or coupled to, any of the various controllable features associated with sauna 100. For example, in one embodiment, control panel 102 is coupled to heat sources located within the walls and/or floor of the sauna.

In other embodiments, control panel 102 may be coupled to, and thus enable control of, other features such as adjustable lighting, timing devices, and the like. Any combination of the electrically operated components of the sauna comprise a power load—i.e., they draw power from an external power source 110. Power from the external power source 110 is provided to the sauna through a power connection cable 111. External power is preferably an alternating current (AC) supply, such as from the power grid, power mains, generator, or other AC supply. In other embodiments, the external power may be direct current (DC) from an external DC supply such as batteries, solar panels, and the like.

Power from the external power source 110 through cable 111 is supplied to the sauna through galvanically isolated fault detection circuitry 120, which includes power distribution components and circuitry such as bus bars, relays, contactors, switches, etc. which distribute the power to the various components of the sauna under the command of logic and control circuitry as will be described in more detail below. Thus, for example, in a preferred embodiment control panel 102 is in communication with logic and control circuitry 110 to allow the control panel 102 to distribute power to the various heating, lighting, and other sauna components to activate and control those components.

Figure 2:
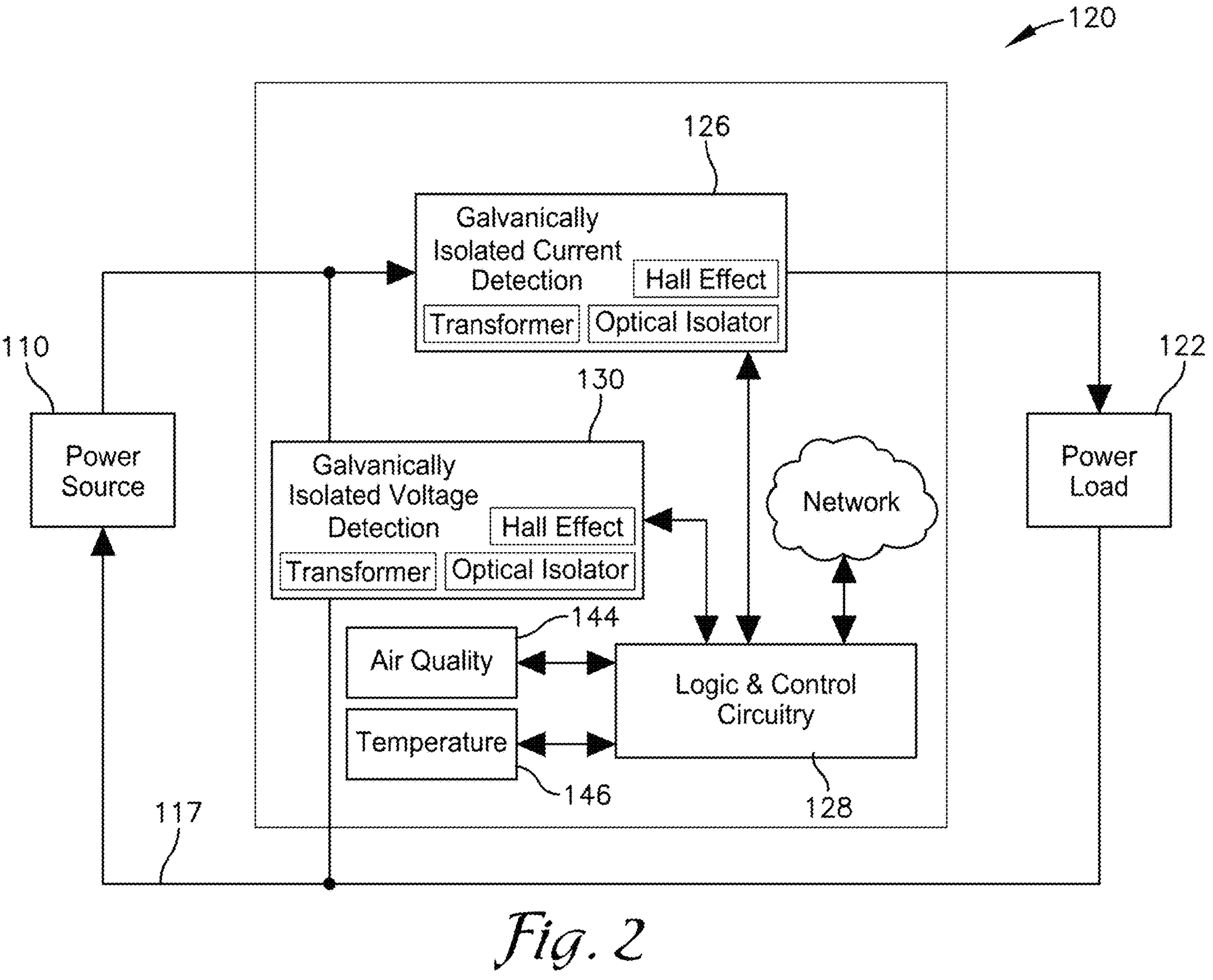
FIG. 2 is a block diagram of the galvanically isolated current and voltage detection circuitry of the sauna of FIG. 1.

Looking to FIG. 2, an expanded block schematic view of the shows that the incoming power source 110 (e.g., incoming AC power) is supplied to the galvanically isolated fault detection circuitry 120 which further passes the AC power to the power load 120 of the sauna. As discussed above, the power load 120 comprises any electrical components, controls, heating elements, lights, etc. in the sauna.

In a preferred embodiment, the galvanically isolated fault detection circuitry 120 includes circuitry to receive alternating current (AC) power from the external power source (such as a power grid, power mains, or other supply of alternating current power), including conditioning circuitry to filter incoming power and switching circuitry, such as contactors, transfer switches, and the like, to allow connecting and disconnecting from the incoming power. In further embodiments, the circuitry may include AC to DC conversion circuitry to allow the device to generate the appropriate power from the incoming power source.

Power load 112 (or power loads) includes any electrical and/or electronic circuitry and/or devices located within or on the sauna that are powered from the power source. In exemplary embodiments, the power loads for the sauna may include resistive heating elements, infrared heating elements, lighting elements, control panels, audio equipment, video displays, monitors, keypads, and other electrically powered devices.

Galvanically isolated current detection module 126 includes circuitry configured and operable to galvanically isolate from the power source, such as a transformer or optical coupling, or Hall effect device. The current detection module 126 further includes circuitry to detect current flowing through the module, using, for example, very low ohmage resistors or other current sensing devices or modules. The current detection module 126 preferably includes communication circuitry to allow the module to communicate with the logic and control circuitry 128 as will be described in more detail below. In exemplary embodiments, current detection module 126 is connected in-line between the power source 110 and the power load 122, in further embodiments similar current detection modules may be similarly connected to individual components and/or devices within the sauna.

Galvanically isolated voltage detection module 130 includes circuitry configured and operable to galvanically isolate from the power source, such as a transformer or optical coupling, or Hall effect device. The voltage detection module 130 further includes circuitry to detect voltage between the incoming power source 110 and ground or neutral 117, in further embodiments similar voltage detection modules may be similarly connected to individual components and/or devices within the sauna. The voltage detection module 130 preferably includes communication circuitry to allow the module to communicate with the logic and control circuitry 128. Looking still to FIG. 2, in exemplary embodiments, the sauna may include an air quality sensor 144, a temperature sensor 146, or other electrical or environmental sensor(s), each in communication with the logic and control circuitry 128 to allow capture, storage, and analysis of data from each of those sensors.

Figure 3:
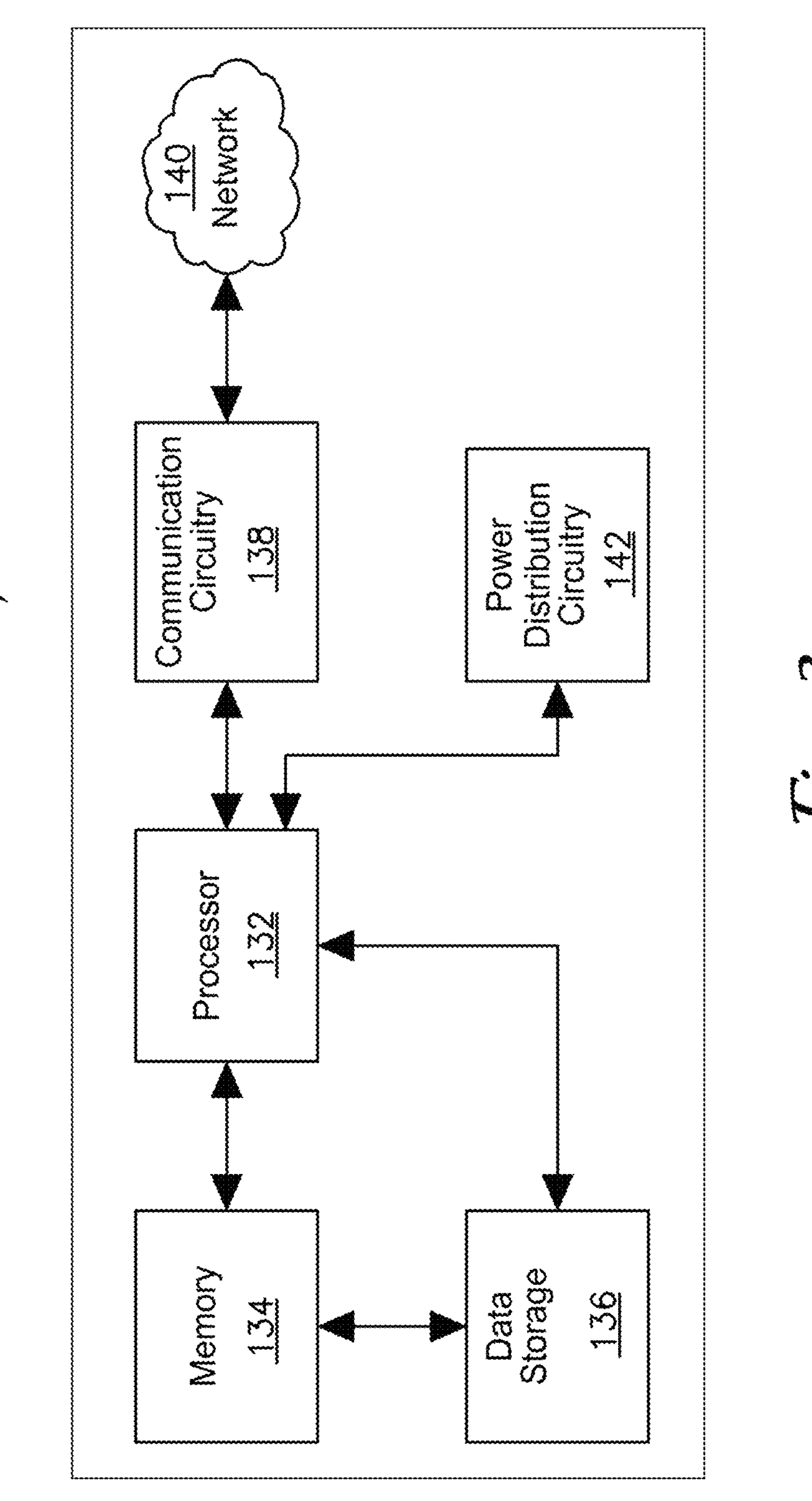
FIG. 3 is a close-up block diagrammatic view of the logic and control circuitry of the galvanically isolated current and voltage detection circuitry of the sauna of FIG. 2.

Looking to FIG. 3, logic and control circuitry 128 includes a processor 132, memory 134, and data storage 136 to allow the processor to execute stored instructions to perform various control and measurement processes, and to store acquired data. The logic and control circuitry 128 further comprises communication circuitry 138 to allow the processor 132 to transmit and receive data to and from other devices and components within the sauna and to external devices or networks such as network 140. Network 140 may be any local or wide area network, such as the Internet, to allow the sauna to function as an Internet of Things (IoT) device. Thus, control of the sauna and access to the fault detection data may be accessed either locally or remotely.

Power distribution circuitry 142 may comprise contactors, transfer switches, and the like, to allow connecting and disconnecting from the incoming power and distribution of power to various devices and components in the sauna under the control of the processor 132. In further embodiments, the power distribution circuitry may include AC to DC conversion circuitry to allow the device to generate the appropriate power from the incoming power source.

Processor 132 may be one or more processors, controllers, microcontrollers, or other computer or control device. It should be understood that one or more processors may be used in the galvanically isolated fault detection circuitry 128 such that processing is distributed among multiple processors or controllers rather than a single controller.

Referring back to FIG. 3, as just described, the processor 132 of the logic and control circuitry 128 is configured to communicate with and exchange data with the one or more galvanically isolated current detection modules 126 and with the one or more galvanically isolated voltage detection modules 130 within the sauna. The logic and control circuitry 128 is preferably configured to monitor voltage and current data from the voltage and current detection modules, and to store, analyze, and generate alerts and/or take other actions based upon the captured data.

For example, in one exemplary embodiment, the microcontroller may detect an overcurrent condition and issue an alert and command incoming power to be shut off using a contactor, transfer switch or other device. Similarly, the microcontroller may detect and over or under voltage condition and shut down power in a similar manner. In other embodiments, the microcontroller may analyze captured data to detect changes in operation of the sauna or of devices and circuitry within the sauna.

Thus, for example, a continued rise in operating current over a period of several weeks may indicate a gradually failing resistive heating element, in which case the microcontroller may generate an alert to a user of the condition and the associated element or circuitry. Thus, an owner/operator of the equipment may preemptively be alerted of an imminent failure and replace the defective element before a severe failure.

Figure 4:
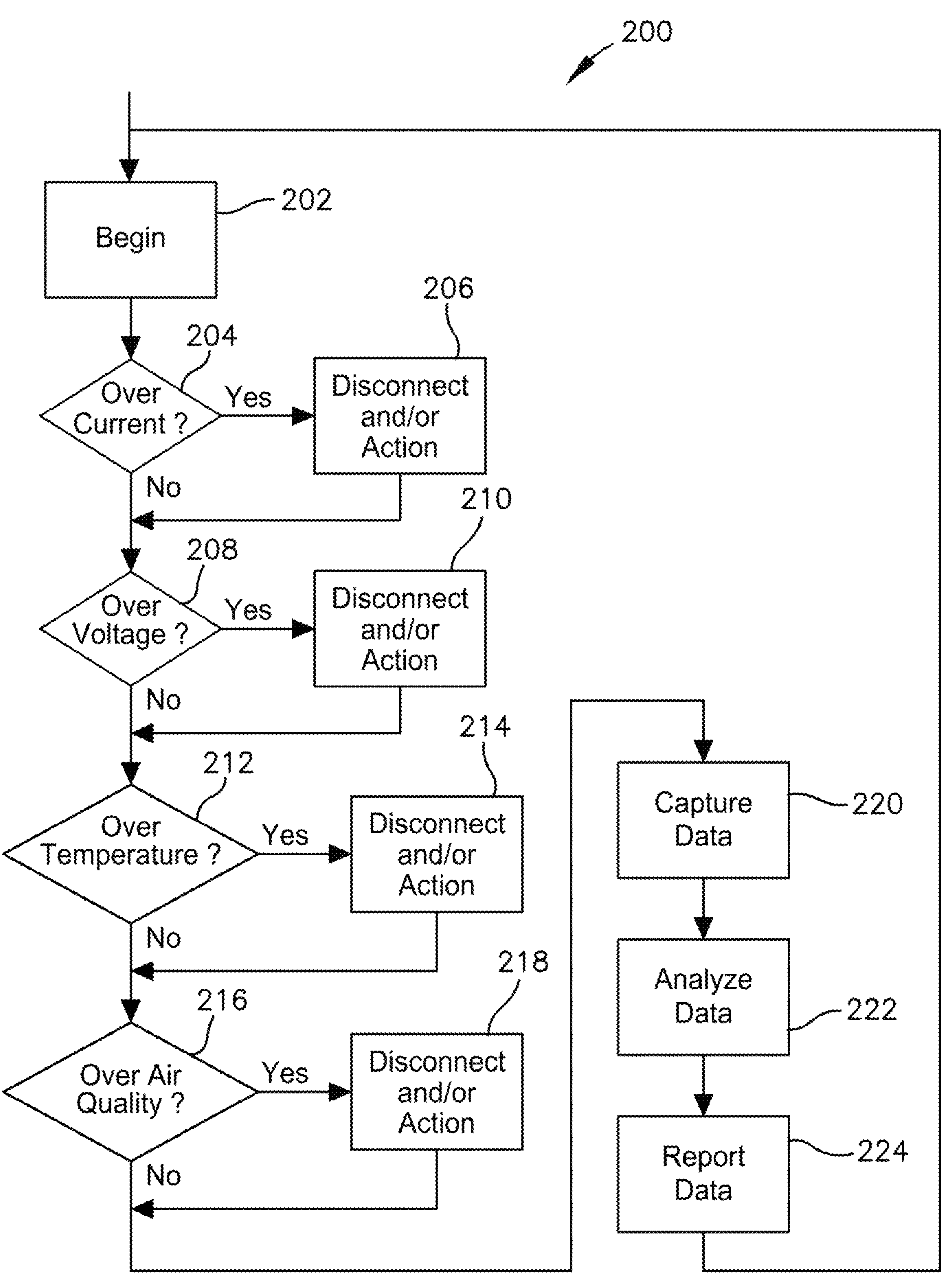
FIG. 4 is a flow diagram of an exemplary operation of the galvanically isolated current and voltage detection circuitry of the sauna of FIG. 1.

Turning to FIG. 4, a flow diagram of voltage and/or current fault detection in accordance with an exemplary implementation of the logic and control circuitry to detect over current or over voltage conditions, and to capture and analyze data using the system of the present invention is depicted generally as 200.

At block 202 the process begins. At block 204 the processor communicates with the galvanically isolated current detection circuitry to determine if that circuitry has detected an overcurrent condition. If so, at block 206 the system disconnects the power source from the power load to prevent the overcurrent condition from continuing. Additionally, at block 206 the system may take additional actions such as recording the time of the detection, the date, the measured current leading to the detection, and the specific fault or type of failure detected.

If no overcurrent is detected, the process continues at block 208, where the logic and control circuitry communicates with the galvanically isolated voltage detection circuitry to determine if that circuitry has detected an over or under voltage condition. If so, at block 210 the system disconnects the power source from the power load to prevent the over or under voltage condition from continuing. condition from continuing. Additionally, at block 210 the system may take additional actions such as recording the time of the detection, the date, the measured voltage leading to the detection, and the specific fault or type of failure detected.

Continuing the process at block 212, the logic and control circuitry determines if an over-temperature condition exists. If so, at block 214, the system disconnects the power source from the power load to prevent the over-temperature condition from continuing. Additionally, at block 214 the system may take additional actions such as recording the time of the detection, the date, the measured temperature leading to the detection, and the specific fault or type of failure detected.

At block 216 the process continues, with the logic and control circuitry determining if an over-air quality condition exists—i.e., if the air quality measurement is outside of a predetermined range. If so, at block 218, the system disconnects the power source from the power load to prevent the over-air quality condition from continuing. Additionally, at block 214 the system may take additional actions such as recording the time of the detection, the date, the measured air quality parameter leading to the detection, and the specific fault or type of failure detected.

At block 220, the system captures desired system parameters, such as voltage, current, temperature, etc., and at block 222 the captured data is analyzed. At block 224 a report summarizing the captured data is stored and or transmitted, e.g., such as through a connected network to an operator or user for further review.

It should be understood that the data collection at block 212 may be performed continuously or on a scheduled basis. Detected faults are preferably reported immediately, with the fault detection data simultaneously recorded and stored in memory or data storage along with other system parameters. In preferred embodiments, a plurality of current detection and voltage detection circuitry modules may be dispersed at various components, elements, and circuitry of the sauna to allow the processor to gather component specific data to further detect and notify of potential problems or malfunctions. Thus, the captured data may comprise overall sauna current and voltage information or may comprise current and voltage information associated with individual devices or components within the sauna.

It should be further understood the system may employ various combinations of sensors as desired, with combinations of one or more voltage, current, temperature, air quality, smoke, and other electrical and environmental sensors deployed throughout various locations in the sauna to monitor and detect desired parameters.

Figure 5:
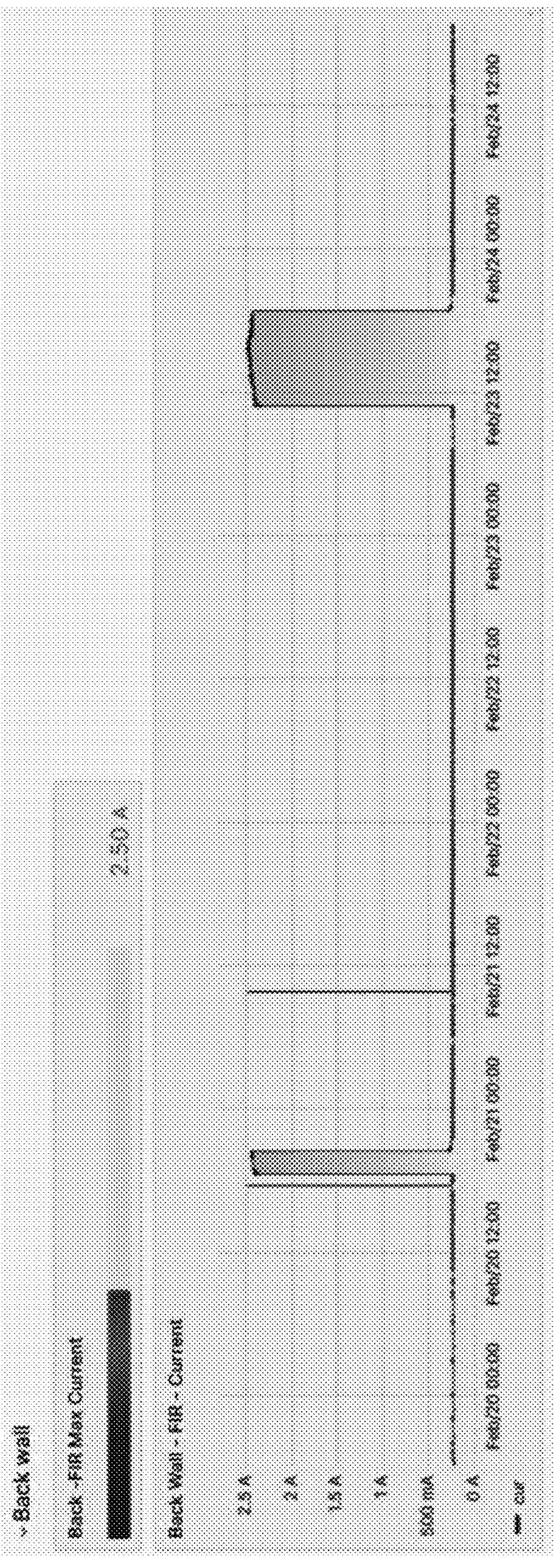
FIG. 5 is a graphical view of current data collected over a period of time from a first back wall heating element of a sauna in accordance with an exemplary embodiment of the present invention.
Figure 6:
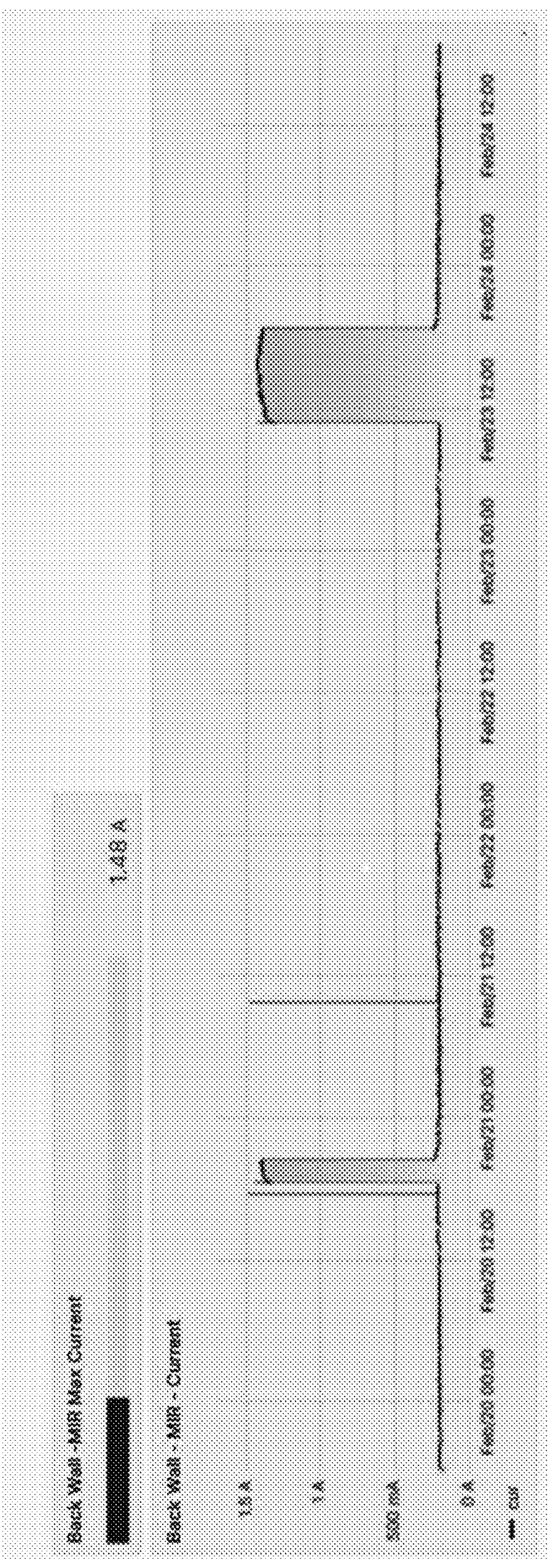
FIG. 6 is a graphical view of current data collected over a period of time from a second back wall heating element of a sauna in accordance with an exemplary embodiment of the present invention.

With the system set forth as described above, FIGS. 5 through 10 depict exemplary data collection and analysis reports that may be provided by the system as claimed. Looking to FIG. 5, a graphical view of current data collected over a period of time from a first back wall heating element is depicted, with FIG. 6 depicting a graphical view of current data from a second back wall heating element.

Figure 7:
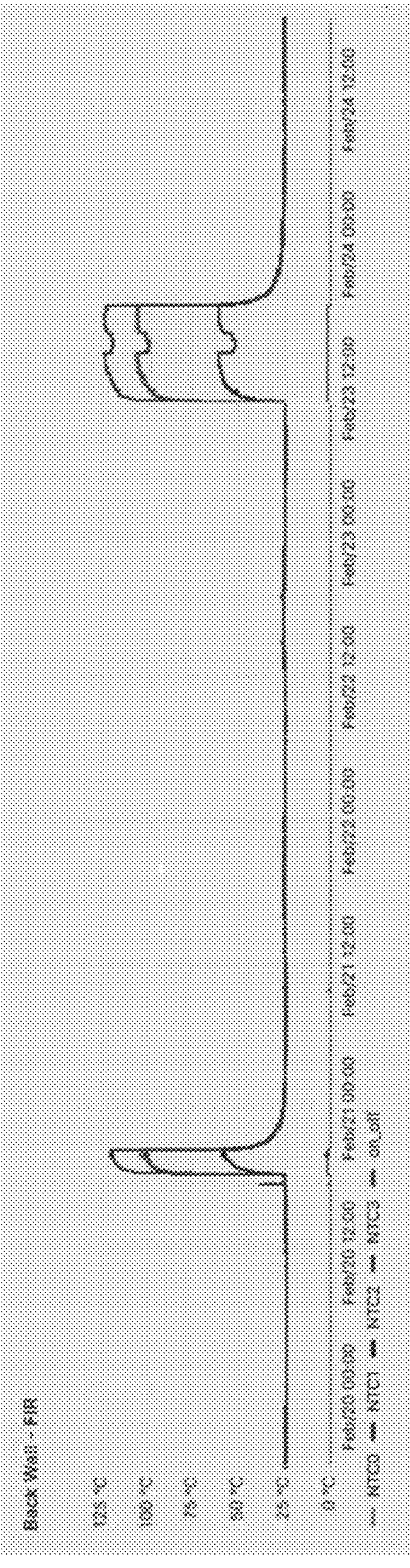
FIG. 7 is a graphical view of temperature data collected over a period of time from a first back wall heating element of a sauna in accordance with an exemplary embodiment of the present invention.
Figure 8:
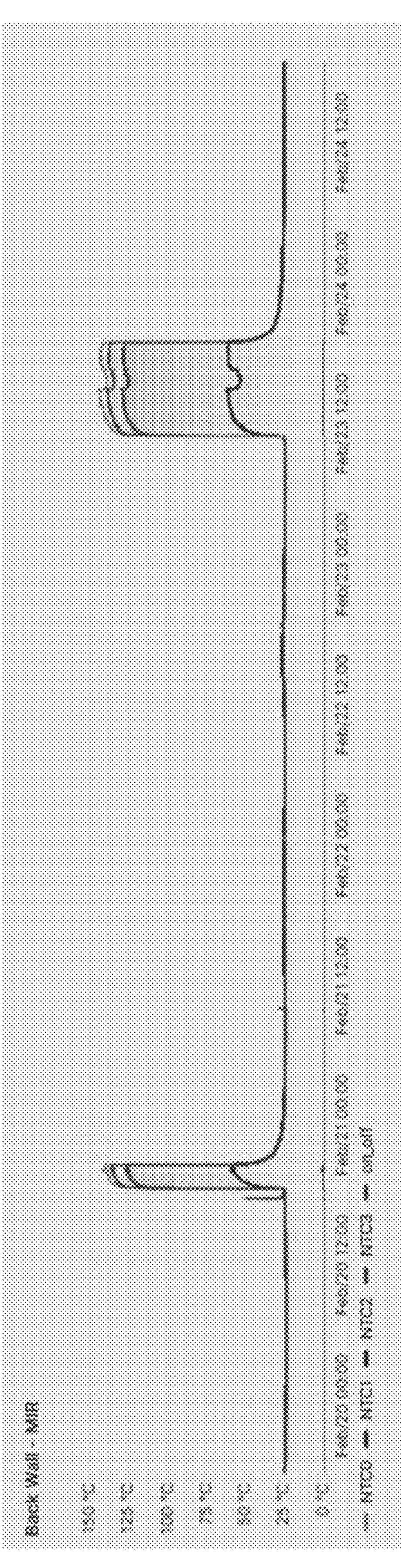
FIG. 8 is a graphical view of temperature data collected over a period of time from a second back wall heating element of a sauna in accordance with an exemplary embodiment of the present invention.

Similarly, FIG. 7 is a graphical view of temperature data collected over a period of time from the first back wall heating element and FIG. 8 is a graphical view of temperature data collected over a period of time from the second back wall heating element.

Figure 9:
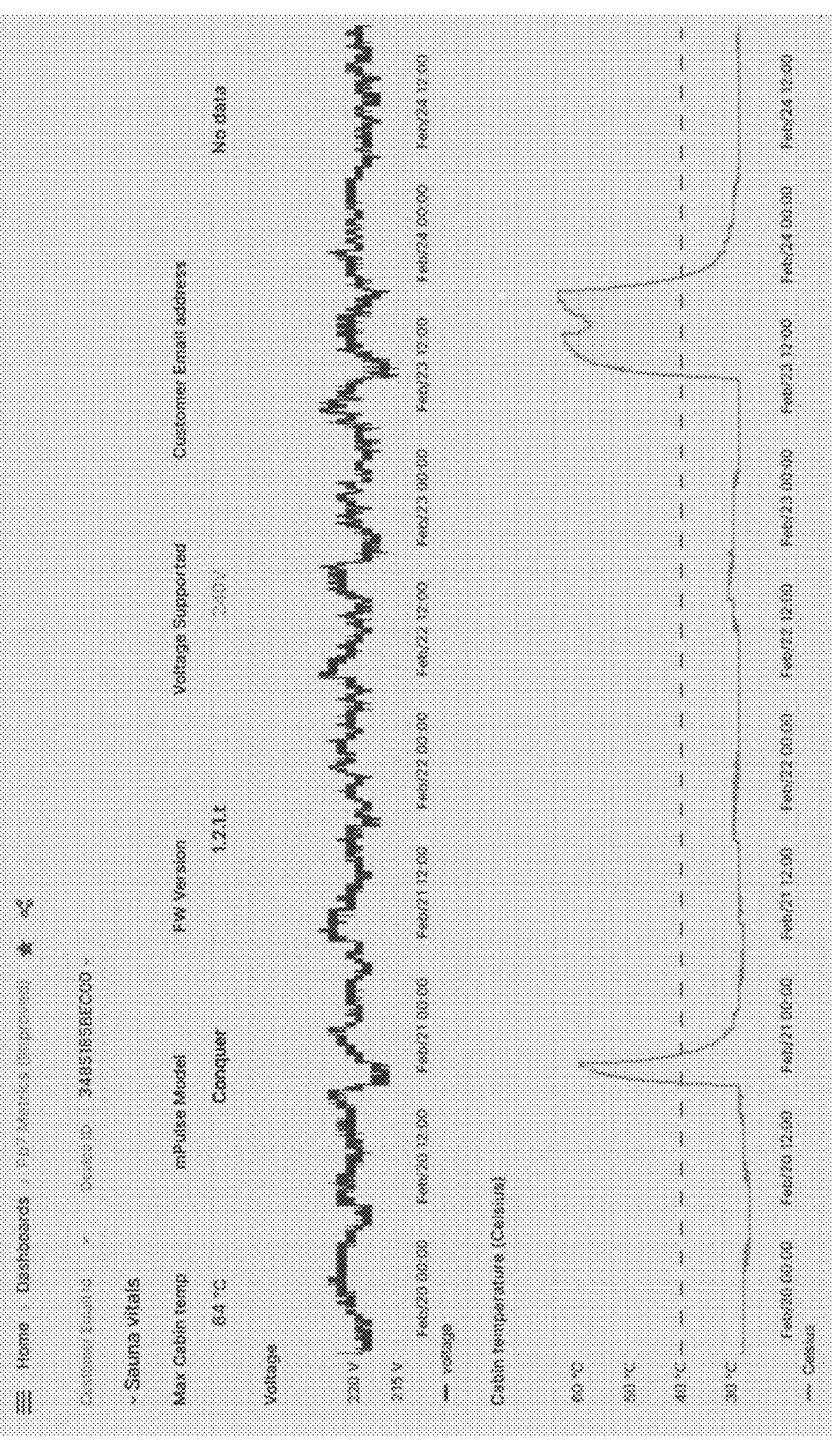
FIG. 9 is a graphical view of voltage and temperature data collected over a period of time of a sauna cabin enclosure area in accordance with an exemplary embodiment of the present invention.
Figure 10:
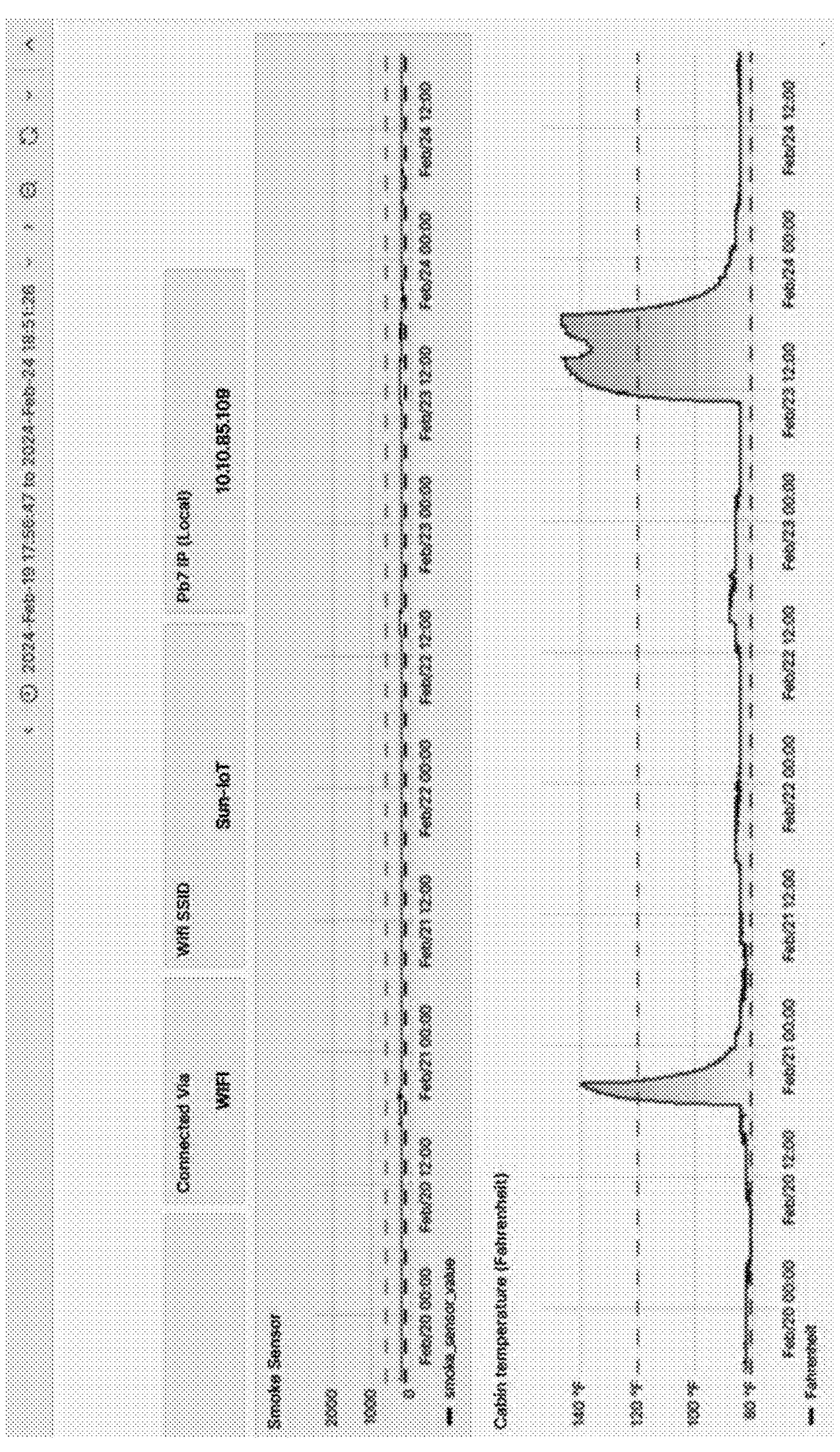
FIG. 10 is a graphical view of smoke sensor and temperature data collected over a period of time of a sauna cabin enclosure area in accordance with an exemplary embodiment of the present invention.

FIG. 9 is a graphical view of voltage and temperature data collected over a period of time of a sauna cabin (i.e., the enclosed area of the sauna), and FIG. 10 is a graphical view of smoke sensor and temperature data collected over a period of time within the sauna cabin enclosure area.

Thus, it can be seen that the system of the present invention allows detection and monitoring of voltage, current, temperature, air quality (e.g., smoke) and other conditions to allow the system to shut-down upon detection of an unsafe condition and to further monitor and capture and record operational data to allow analysis and reporting of parameters over time.

Many different arrangements of the various components depicted, as well as components not shown, are possible without departing from the scope of the claims below. Embodiments of the technology have been described with the intent to be illustrative rather than restrictive. Alternative embodiments will become apparent to readers of this disclosure after and because of reading it. Alternative means of implementing the aforementioned can be completed without departing from the scope of the claims below. Identification of structures as being configured to perform a particular function in this disclosure and in the claims below is intended to be inclusive of structures and arrangements or designs thereof that are within the scope of this disclosure and readily identifiable by one of skill in the art and that can perform the particular function in a similar way. Certain features and sub-combinations are of utility and may be employed without reference to other features and sub-combinations and are contemplated within the scope of the claims.

What is claimed is:

1. A sauna comprising:

galvanically isolated current detection circuitry;

galvanically isolated voltage detection circuitry; and logic and control circuitry in communication with the galvanically isolated current detection circuitry and with the galvanically isolated voltage detection circuitry, the logic and control circuitry configured to capture current and voltage data over time for individual electrically powered components of the sauna, to perform analysis of the captured data to detect gradual changes over time indicative of latent or gradual malfunctions of individual components of the sauna, wherein the gradual changes comprise changes in the captured current and/or voltage occurring over a plurality of measurements over time, and to generate alerts based on detection of the latent or gradual malfunctions.

2. The sauna of claim 1, wherein the detected malfunction comprises an over-current condition, an over-voltage condition, an under-voltage condition, or combinations thereof.

3. The sauna of claim 1, wherein the logic and control circuitry is further operable to actuate disconnect circuitry to disconnect power to the sauna upon detection of a malfunction.

4. The sauna of claim 1, wherein the galvanically isolated current detection circuitry comprises a transformer, an optical isolator, or combinations thereof.

5. The sauna of claim 1, wherein the galvanically isolated voltage detection circuitry comprises a transformer, an optical isolator, or combinations thereof.

6. The sauna of claim 1, wherein the logic and control circuitry comprises communication circuitry operable to communicate over a local or wide-area network.

7. The sauna of claim 1, wherein the logic and control circuitry comprises a processor and a memory having instructions stored thereon which, when executed, cause the processor to perform data monitoring and storage operations.

8. A sauna comprising:

galvanically isolated current detection circuitry;

logic and control circuitry in communication with the galvanically isolated current detection circuitry, the logic and control circuitry configured to capture current data for individual components of the sauna over time, to analyze the captured current data to detect gradual changes indicative of malfunction or impending malfunction of the components, wherein the gradual changes comprise, for a resistive heating element of the sauna, a continued rise in operating current over a period of several weeks, and to alert a user to the detected malfunction or impending malfunction.

9. The sauna of claim 8 wherein the detected malfunction comprises an over-current condition.

10. The sauna of claim 8, wherein the logic and control circuitry is further operable to actuate disconnect circuitry to disconnect power to the sauna upon detection of a malfunction.

11. The sauna of claim 8, wherein the galvanically isolated current detection circuitry comprises a transformer, an optical isolator, or combinations thereof.

12. The sauna of claim 8, further comprising galvanically isolated voltage detection circuitry.

13. A sauna comprising:

galvanically isolated current detection circuitry configured to detect current associated with a plurality of electrical components of the sauna; and logic and control circuitry in communication with the current detection circuitry, the logic and control circuitry configured to analyze detected current over time associated with the plurality of electrical components to detect gradual changes over time indicative of latent or gradual malfunction or impending malfunction of the components, wherein the gradual changes comprise changes in the detected current occurring over a plurality of measurements over time, and to alert a user based on the detected latent or gradual malfunction or impending malfunction.

14. The sauna of claim 13, wherein the detected malfunction comprises an over-current condition.

15. The sauna of claim 13, wherein the logic and control circuitry is further operable to actuate disconnect circuitry to disconnect power to the sauna upon detection of a malfunction.

16. The sauna of claim 13, wherein the galvanically isolated current detection circuitry comprises a transformer, an optical isolator, or combinations thereof.

17. The sauna of claim 13, wherein the logic and control circuitry comprises communication circuitry operable to communicate over a local or wide-area network.

18. The sauna of claim 17, wherein the logic and control circuitry comprises a processor and a memory having instructions stored thereon which, when executed, cause the processor to perform data monitoring and storage operations.

19. The sauna of claim 18, wherein the logic and control circuitry is operable to periodically capture and store sauna parameters and to generate reports comprising the captured parameters.

20. A sauna comprising:

a power source;

a power load comprising one or more electrically powered components of the sauna;

galvanically isolated current detection circuitry disposed between the power source and the power load and configured to detect a current supplied from the power source to the power load;

galvanically isolated voltage detection circuitry disposed between the power source and a neutral or ground line of the sauna and configured to detect a voltage of the power source; and logic and control circuitry in communication with the galvanically isolated current detection circuitry and with the galvanically isolated voltage detection circuitry, wherein the logic and control circuitry is configured to receive current data from the galvanically isolated current detection circuitry and to receive voltage data from the galvanically isolated voltage detection circuitry and to capture the current data and the voltage data over time for individual electrically powered components of the sauna and to generate an alert upon detection of a fault condition based on the received current data or voltage data including detection of gradual changes over time indicative of a malfunction of at least one of the electrically powered components, wherein the gradual changes comprise, for a resistive heating element of the sauna, a continued rise in operating current over a period of several weeks.

* * * * *